(12) United States Patent
Mallinson

(10) Patent No.: US 10,965,257 B2
(45) Date of Patent: Mar. 30, 2021

(54) SIGNAL PROCESSING CIRCUIT WITHOUT CLOCK MEDIATION

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/940,396

(22) Filed: Jul. 28, 2020

(65) Prior Publication Data

US 2021/0036665 A1 Feb. 4, 2021

Related U.S. Application Data

(60) Provisional application No. 62/880,042, filed on Jul. 29, 2019.

(51) Int. Cl.
*H03F 3/00* (2006.01)
*H03K 17/94* (2006.01)

(52) U.S. Cl.
CPC .............. *H03F 3/005* (2013.01); *H03K 17/94* (2013.01)

(58) Field of Classification Search
CPC ................................ H03F 3/005; H03K 17/94
USPC .......................................................... 327/337
See application file for complete search history.

(56) References Cited

U.S. PATENT DOCUMENTS 6,061,009 A * 5/2000 Krone ................... H03M 3/364
327/337

OTHER PUBLICATIONS

"Switched Capacitor", Wikipedia, Mar. 6, 2019, "https://en.wikipedia.org/w/index.php?title=Switched_capacitor&oldid=886414624".

(Continued)

*Primary Examiner* — Tomi Skibinski
(74) *Attorney, Agent, or Firm* — Gard & Kaslow LLP

(57) ABSTRACT

A signal processing circuit that achieves functionality similar to that of a switched capacitor circuit without the necessity a clock. The circuit compensates for finite open loop gain and for offset voltages in the components, allowing the circuit to "calculate" the result of a problem represented by the circuit essentially immediately upon the presentation of a new input or set of inputs. After the circuit is initialized to remove gain, an input is applied to the circuit, and propagates through the network and affects the state of amplifier outputs; the propagation from the input through capacitors to the ultimate output(s) of the circuit is the analog calculation taking place. The calculation is not mediated by a clock, but rather the calculation corresponds to the circuit's one-time response to the application of the inputs. Using these techniques complex signal processing circuits and even analog neural networks may be constructed.

11 Claims, 8 Drawing Sheets

(56) References Cited

OTHER PUBLICATIONS

Jose L. Ausin, "High-Selectivity Switched-Capacitor Bandpass Filter with Quasi-Continuous Quality Factor Tunability", Analog Integrated Circuits and Signal Processing, 33(2), pp. 117-126, Nov. 2002.

"EE247 Lecture 9 Switched-Capacitor Filters Today", University of California at Berkeley, 2005, https://pdfslide.net/documents/ee247-lecture-9-insteecs-ee247fa05lecturesI922f05pdf-eecs-247-lecture.html.

"Introduction to Switched Capacitor Circuits", Chapter 12, pp. 395, 438, University of California at Los Angeles, archived Apr. 13, 2019, http://www.seas.ucla.edu/brweb/teaching/AIC_Ch12.pdf.

"Activity: The Switched Capacitor", Analog Devices Wiki, archived Nov. 8, 2017, https://wiki.analog.com/university/courses/electronics/electronics-lab-19.

* cited by examiner

SIGNAL PROCESSING CIRCUIT WITHOUT CLOCK MEDIATION

This application claims priority from Provisional Application No. 62/880,042, filed Jul. 29, 2019, which is incorporated by reference herein in its entirety.

FIELD OF THE INVENTION

The present invention relates generally to electronic circuits, and more particularly to circuits for signal processing.

BACKGROUND OF THE INVENTION

Switched capacitor circuits are well known in the art. The principle of a switched capacitor circuit is that charge is processed as an analog quantity representative of a signal. A charge is manipulated by controlling the corresponding voltage that appears across a capacitor holding the given charge. Operational amplifiers located at certain signal processing nodes in the network inspect the voltage on the capacitors without disturbing the charge present on them. Switches connect or disconnect additional capacitors, usually of differing values, and charge flows between the capacitors as required to solve the second of Kirchhoff's laws, i.e., that the sum of the voltages around any closed loop must be zero. By these means analog computers may be constructed to solve a wide range of problems, including amplification to filtering, as well as data conversion from analog to digital and vice-versa.

One limitation of switched capacitor circuits is that they use a clock. The clock synchronizes the operation of the circuit, in effect a charge-processing state machine, created using the switched capacitor methodology. Switched capacitor circuits thus constitute a signal processing technique or methodology. Using this methodology, circuits may be created to solve a range of problems.

Although there may be a nominally infinite set of different charges on the capacitors of a switched capacitor circuit, there is a finite set of states of the circuit corresponding to the positions of the switches within the switched capacitor circuit, and the transitions between these switch positions represent a state machine.

An example of a switched capacitor circuit of the known art is shown in FIG. 1. In circuit 100, the amplifier A is assumed to have a nominally infinite input impedance and so is able to monitor the voltage on the node on the top of capacitor $C_P$ without disturbing the charge on it. The switches Φ1 and Φ2 execute a sequence of states, the three Φ1 switches moving together and the two Φ2 switches moving together.

A more complex example is shown in FIG. 2. Switched capacitor circuit 200 in FIG. 2(a) has four categories of switches: Φ1, Φ2, Φ1q, and Φ2q. The four switch categories are controlled by four independent clock signals. Circuit 200 is operated by manipulating the switches with these clocks, such that predictable amounts of charge can be transferred, usually to an operational amplifier ("op-amp") configured as an integrator. In turn, the low impedance output of that op-amp is used to establish a charge on another capacitor.

FIG. 2(b) shows the clock signals used to control the switches in circuit 200. In the prior art, a clock, or sequence of clocks, mediates the flow of charge from place to place and in so doing creates a sampled data system that represents what is often a continuous quantity.

The simplest known switched capacitor circuit is the "switched capacitor resistor" 300 as shown in FIG. 3. The switches S1 and S2 connect the capacitor CS alternately to the input and output of the switched capacitor 300 with a given frequency. Each switching cycle transfers, or propagates, a charge from the input to the output at a certain rate, similar to a resistor. The average charge delivered is proportional to the voltage across the capacitor, again similar to a resistor, and occurs at the switching frequency.

It is the operation of this switched capacitor resistor, and the associated clocks, that enables the switched capacitor methodology. In the switched capacitor circuits of the known art it is believed possible to always identify one or more such switched capacitor circuits.

It would be desirable to be able to obtain a similar functionality to that of switched capacitor circuits without the necessity of a clock or clocks.

SUMMARY OF THE INVENTION

Described herein is a signal processing circuit that achieves functionality similar to that of a switched capacitor circuit without the necessity of one or more clocks.

One embodiment describes a signal processing circuit, comprising: a first amplifier unit comprising: a first amplifier having a non-inverting input, an inverting input and an output, the non-inverting input connected to a ground; a first capacitor having a first end connected to the inverting input of the first operational amplifier and a second end connected to the output of the first amplifier; and a first single-throw switch connected to a reset signal and configured to be in either an open position or a closed position based upon the reset signal, and having a first end connected to the inverting input of the first amplifier and a second end connected to the output of the first amplifier; a second amplifier unit comprising: a second amplifier having a non-inverting input, an inverting input and an output, the non-inverting input connected to the ground; a second capacitor having a first end connected to the inverting input of the second amplifier and a second end connected to the output of the second amplifier; and a second single-throw switch connected to the reset signal and configured to be in either an open position or a closed position based upon the reset signal, and having a first end connected to the inverting input of the second amplifier and a second end connected to the output of the second amplifier; a third single-throw switch connected to the reset signal and configured to be in either a first position or a second position based upon the reset signal, and having a first end and a second end, the first end configured to receive an input signal when the switch is in the first position and to connect to the ground when the switch is in the second position; a third capacitor having a first end connected to the second end of the third single-throw switch and a second end connected to the inverting input of the first amplifier; and a fourth capacitor having a first end connected to the output of the first amplifier and a second end coupled to the inverting input of the second amplifier.

Another embodiment describes a signal processing circuit, comprising: a first amplifier unit comprising: a first amplifier having a non-inverting input, an inverting input and an output, the non-inverting input connected to a ground; a first capacitor having a first end connected to the inverting input of the first amplifier and a second end connected to the output of the first amplifier; and a first single-throw switch connected to a reset signal and configured to be in either an open position or a closed position based upon the reset signal, and having a first end connected to the inverting input of the first amplifier and a second end connected to the output of the first amplifier; a second amplifier unit comprising: a second amplifier having a non-inverting input, an inverting input and an output, the non-inverting input connected to the ground; a second capacitor having a first end connected to the inverting input of the second operational amplifier and a second end connected to the output of the second operational amplifier; and a second single-throw switch connected to the reset signal and configured to be in either an open position or a closed position based upon the reset signal, and having a first end connected to the inverting input of the second operational amplifier and a second end connected to the output of the second operational amplifier; a third amplifier unit comprising: a third amplifier having a non-inverting input, an inverting input and an output, the non-inverting input connected to the ground; a third capacitor having a first end connected to the inverting input of the third amplifier and a second end connected to the output of the third amplifier; and a third single-throw switch connected to the reset signal and configured to be in either an open position or a closed position based upon the reset signal, and having a first end connected to the inverting input of the third amplifier and a second end connected to the output of the third amplifier; a fourth amplifier unit comprising: a fourth amplifier having a non-inverting input, an inverting input and an output, the non-inverting input connected to the ground; a fourth capacitor having a first end connected to the inverting input of the fourth amplifier and a second end connected to the output of the fourth amplifier; and a fourth single-throw switch connected to the reset signal and configured to be in either an open position or a closed position based upon the reset signal, and having a first end connected to the inverting input of the fourth amplifier and a second end connected to the output of the fourth amplifier; a fifth single-throw switch connected to the reset signal and configured to be in either a first position or a second position based upon the reset signal, and having a first end and a second end, the first end configured to receive an input signal when the switch is in the first position and to connect to the ground when the switch is in the second position; a fifth capacitor having a first end connected to the second end of the fifth single-throw switch and a second end connected to the inverting input of the first amplifier; a sixth single-throw switch connected to a reset signal and configured to be in either a first position or a second position based upon the reset signal, and having a first end and a second end, the first end configured to receive an input signal when the switch is in the first position and to connect to the ground when the switch is in the second position; a sixth capacitor having a first end connected to the second end of the sixth single-throw switch and a second end connected to the inverting input of the third amplifier; a seventh capacitor having a first end connected to the output of the first amplifier and a second end coupled to the inverting input of the second amplifier; an eighth capacitor having a first end connected to the output of the third amplifier and a second end coupled to the inverting input of the fourth amplifier; a ninth capacitor having a first end connected to the output of the first amplifier and a second end coupled to the inverting input of the fourth amplifier; and a tenth capacitor having a first end connected to the output of the third amplifier and a second end coupled to the inverting input of the second amplifier.

Yet another embodiment describes a signal processing network, comprising: a plurality of signal processing circuits, each signal processing circuit comprising: a first amplifier unit comprising: a first amplifier having a non-inverting input, an inverting input and an output, the non-inverting input connected to a ground; a first capacitor having a first end connected to the inverting input of the first operational amplifier and a second end connected to the output of the first amplifier; and a first single-throw switch connected to a reset signal and configured to be in either an open position or a closed position based upon the reset signal, and having a first end connected to the inverting input of the first amplifier and a second end connected to the output of the first amplifier; a second amplifier unit comprising: a second amplifier having a non-inverting input, an inverting input and an output, the non-inverting input connected to the ground; a second capacitor having a first end connected to the inverting input of the second amplifier and a second end connected to the output of the second amplifier; and a second single-throw switch connected to the reset signal and configured to be in either an open position or a closed position based upon the reset signal, and having a first end connected to the inverting input of the second amplifier and a second end connected to the output of the second amplifier; a third single-throw switch connected to the reset signal and configured to be in either a first position or a second position based upon the reset signal, and having a first end and a second end, the first end configured to receive an input signal when the switch is in the first position and to connect to the ground when the switch is in the second position; a third capacitor having a first end connected to the second end of the third single-throw switch and a second end connected to the inverting input of the first amplifier; and a fourth capacitor having a first end connected to the output of the first amplifier and a second end coupled to the inverting input of the second amplifier; a fifth capacitor having a first end connected to the output of the first amplifier in a first one of the plurality of signal processing units and a second end coupled to the inverting input of the second amplifier in a second one of the plurality of signal processing units; and a sixth capacitor having a first end connected to the output of the first amplifier in the second one of the plurality of signal processing units and a second end coupled to the inverting input of the second amplifier in a third one of the plurality of signal processing units.

DETAILED DESCRIPTION OF THE INVENTION

Figure 1:
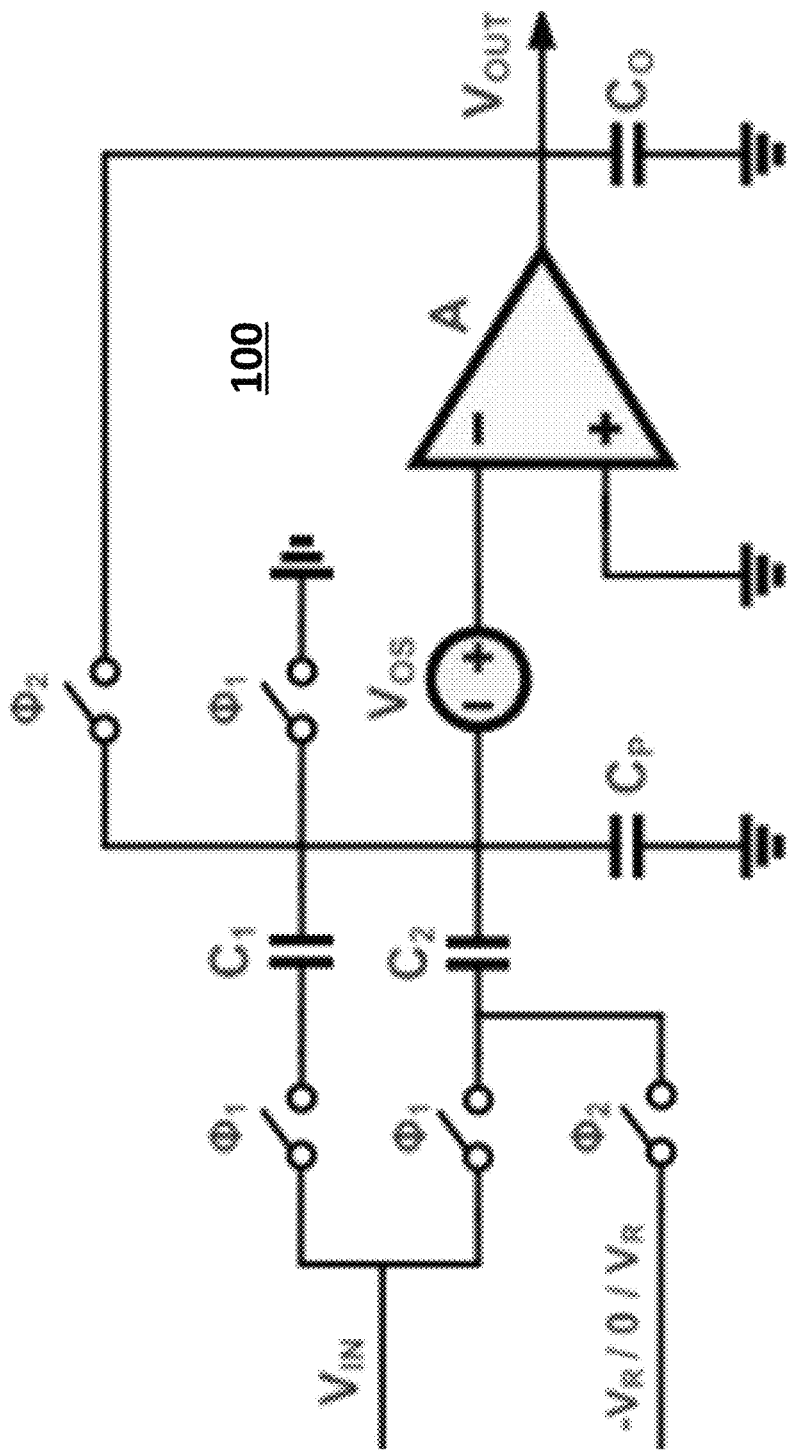
FIG. 1 is a diagram of a switched capacitor circuit as is known in the prior art.
Figure 2:
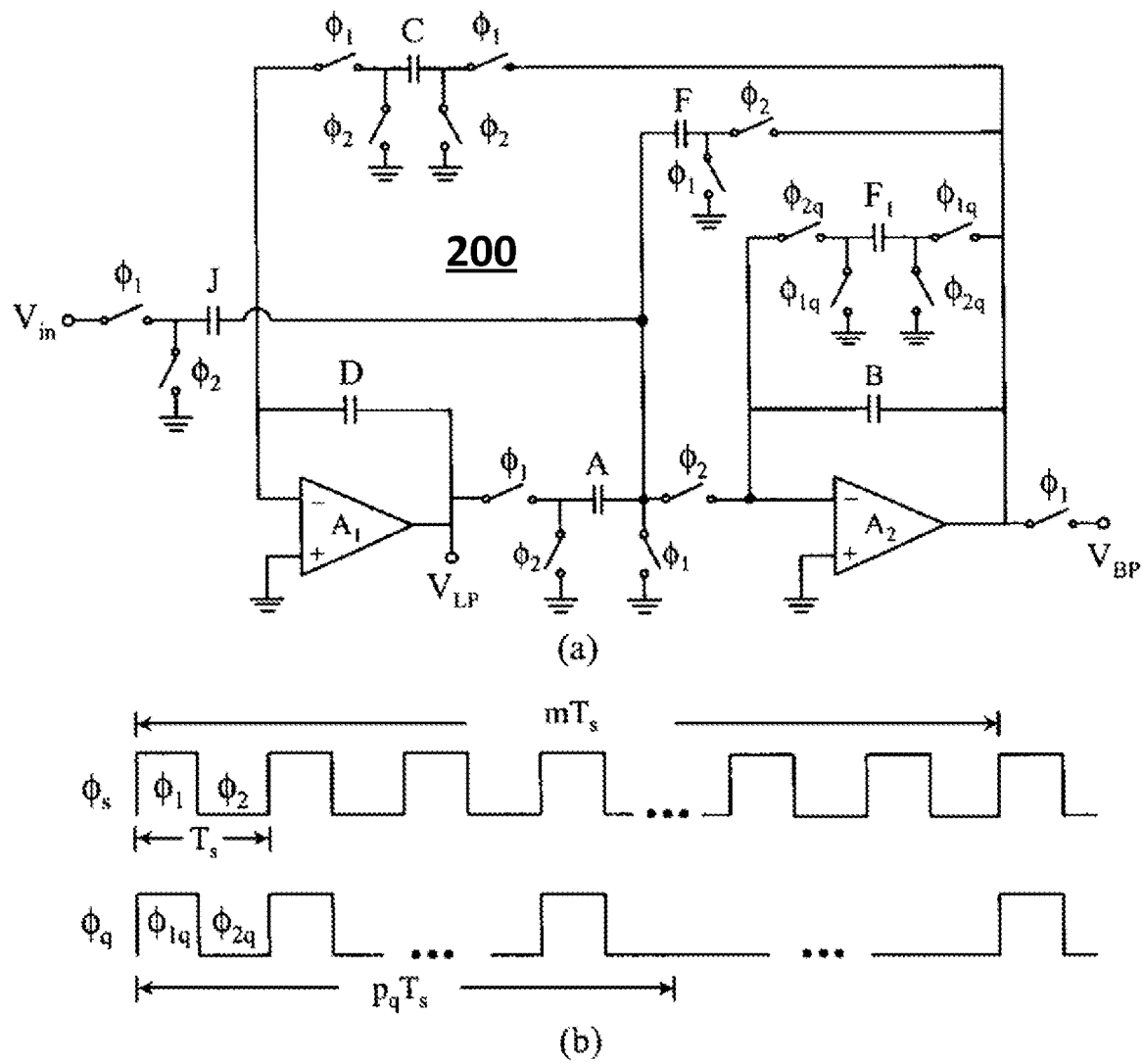
FIG. 2 is a diagram of another switched capacitor circuit as is known in the prior art.
Figure 3:
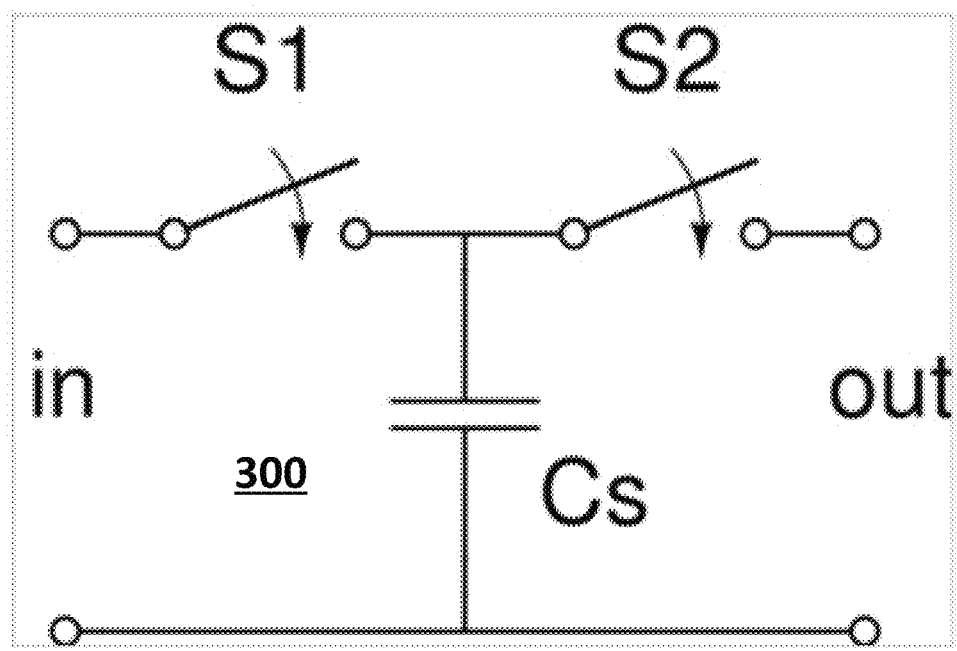
FIG. 3 is a diagram of the simplest switched capacitor circuit, a switched capacitor resistor, as is known in the prior art.

Described herein is a signal processing circuit that achieves functionality similar to that of a switched capacitor circuit without the necessity of one or more clocks. The circuit compensates for offset voltages and in some configurations also for finite open loop gain in the components, thus allowing the circuit to "calculate" the result of a problem represented by the circuit essentially immediately upon the presentation of a new input or set of inputs.

The circuit operates by initializing the circuit with a means to remove gain; once this is done, an input is applied to the circuit. The application of the input propagates through the network and affects the state of amplifier outputs, which in turn may affect the output of other amplifiers. It is this propagating disturbance that is the desired action of the circuit; the propagation from the input through the capacitors, now not configured as resistors so that there is no need for a controlling clock, to the ultimate outputs of the circuit is the analog calculation taking place. The calculation is not mediated by a repeating clock, but rather the calculation corresponds to the circuit's one-time response to the application of the inputs.

In the known art, circuit networks attenuate signal levels unless there are active elements to maintain the signal level, such as amplifiers. However, the active elements introduce errors, for example, in the form of their offset voltages. Switched capacitor circuits can avoid these offsets by effectively making resistances from capacitors, and switching around those capacitors at specific rates. However, as with other known circuits, the switched capacitor circuit requires multiple cycles to remove such offsets and express its function; for example, there may be one or more cycles to reset, then one or more cycles to function. Thus, there is a separate phase of operation from the desired function in which the switched capacitor circuit compensates for the offsets.

By contrast, in the present approach, the signal processing circuit calculates a result from a new input essentially immediately (subject to propagation time), i.e., in one operation of the circuit. After this the amplifiers reset to await the next input. There is no phase separate from operation in which the circuit compensates for offsets; rather, the operation itself is independent of the offset voltages of any components in the circuit.

One effect of this is that, since a switched capacitor circuit provides an average value over time, it can produce certain results that the present approach cannot, such as a sine wave. Nonetheless, the present approach can produce many results that a switched capacitor circuit either cannot produce at all or can only produce with great difficulty, such as a fast Fourier transform (FFT), which may be wildly inaccurate in the presence of offsets.

The present approach improves upon another prior art circuit, a charge distribution network. In one prior art example, a charge distribution digital-to-analog converter (DAC) similarly works within one cycle to produce a result from an input, and, in its simplest implementation, has no active components. However, to avoid signal loss, the charge distribution DAC requires an amplifier to provide voltage gain, and is thus again sensitive to the offset voltages of the amplifier. The present approach is again insensitive to such offsets within a network.

Figure 4:
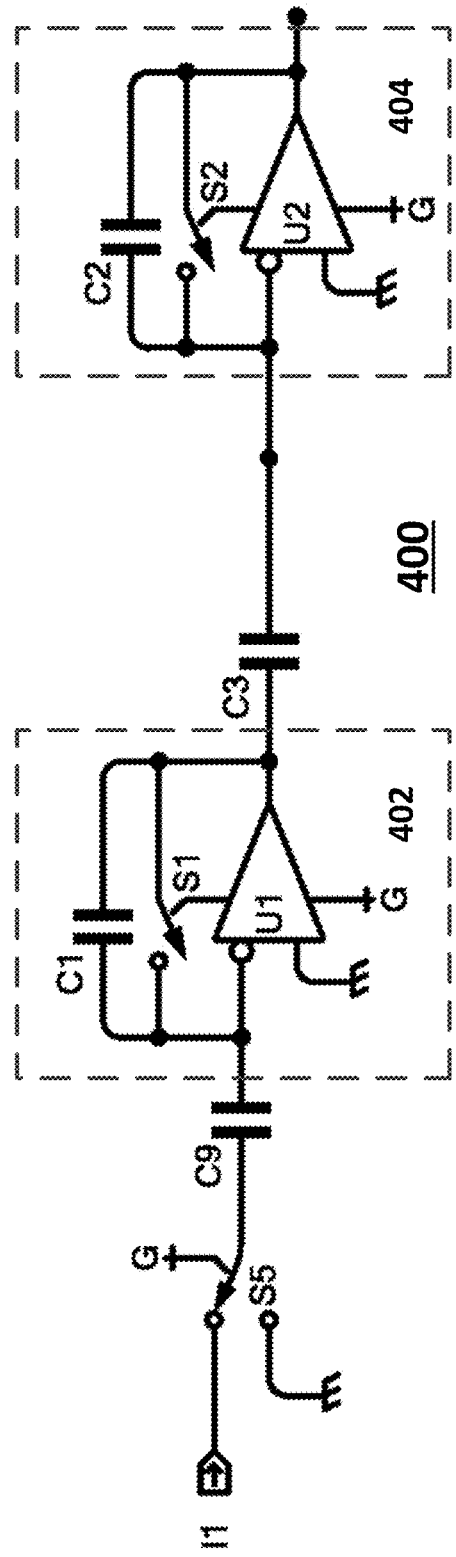
FIG. 4 is a diagram of a signal processing circuit according to one embodiment.

FIG. 4 illustrates a basic signal processing circuit as may be used in accordance with the present approach. Circuit 400 includes two "amplifier units" 402 and 404. Each amplifier unit includes an amplifier, a switch, and a capacitor. Thus, amplifier unit 402 contains an amplifier U1, a switch S1, and a capacitor C1. Amplifier U1 has a non-inverting input connected to a ground, an inverting input, and an output. Switch S1 and capacitor C1 are both connected between the output and the inverting input of amplifier U1. Switch 1 may be open or closed; in the closed position, switch S1 shorts capacitor C1 and removes its effect from circuit 400. The other amplifier unit 404 of circuit 400 is similarly constructed with an amplifier U2, a switch S2, and a capacitor C2. (The switches illustrated herein are generally single-throw switches, i.e., having only two positions, in some cases open or closed and in other cases making alternate connections.)

The inverting input of amplifier U1 receives an input signal I1 through a switch S5 and a capacitor C9 when switch S5 is in one position, and is connected to ground when switch S5 is in the other position. Another capacitor C3 connects the output of amplifier U1 to the inverting input of amplifier U2.

Each amplifier U1 and U2 receives a control signal, a "reset signal" G as further explained below, which controls the switch associated with the amplifier (i.e., switches S1 and S2, respectively) and potentially affects the amplifier as well. For example, reset signal G may cause the power level of the amplifiers U1 and U2 to be reduced so as to limit current consumption, although this is not necessary to the operation of circuit 400. (If this optional reduction of power level in the amplifiers is not used, reset signal G may be applied only directly to switches S1 and S2 and not to the amplifiers U1 and U2 themselves.) The amplifiers U1 and U2 are typically op-amps.

Capacitor C3 corresponds to what would typically be a switched capacitor resistor in a switched capacitor circuit according to known approaches, but are not so configured in the present approach. One end of capacitor C3 is connected to the output of amplifier U1, and the other end of capacitor C3 is coupled to the inverting input of amplifier U2 (possibly through a switch, as further explained below.)

Circuit 400 conserves charge, and removing the input signal will thus generally result in the circuit returning to its signal-independent state. However, over time, offset values in the amplifiers will degrade, and it thus desirable to have a mechanism to completely remove any errors in the values of the offsets. Amplifier U1 and associated switch S1, as controlled by reset signal G, constitute the means to remove the gain and cause capacitor C1 associated with amplifier U1 to acquire a defined and quiescent, signal-independent state; a similar effect applies to capacitor C2.

Thus, reset signal G is considered a "reset" signal because it completely clears the prior calculation that the circuit has performed. Reset signal G is not a clock signal or driven by a clock, and has no predefined periodicity, but rather is activated when it is appropriate to clear the circuit in preparation for a new problem, i.e., a new set of inputs, to be applied.

In circuit 400, switch S5, which controls whether the input signal reaches capacitor C9 and thus amplifier U1, is also shown as being controlled by the reset signal G. In some embodiments, this instance of reset signal G may be delayed or advanced from the reset signal G that controls the other switches in circuit 400 to allow some short interval of time for the amplifiers to power up or for similar considerations.

Circuit 400 operates to propagate an input signal with gain, while remaining independent of the offset voltages of the amplifiers. While this may not be a particularly useful result by itself, combinations of circuits such as signal processing circuit 400 can achieve great functionality.

Figure 5:
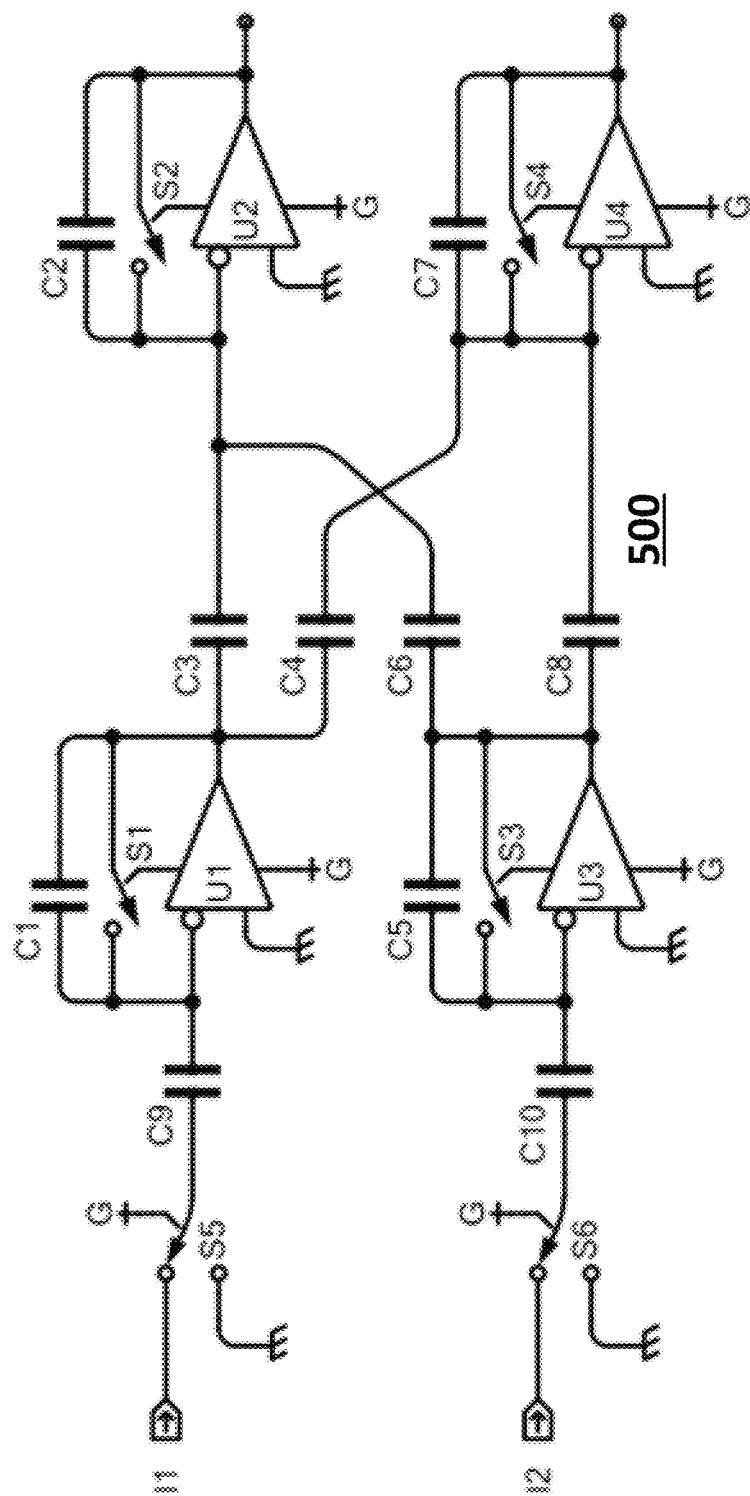
FIG. 5 is a diagram of a signal processing circuit according to another embodiment.

FIG. 5 illustrates one embodiment of the present approach in which individual signal processing circuits such as circuit 400 of FIG. 4 may be interconnected. It will be seen that circuit 500 of FIG. 5 combines two of the signal processing circuits shown as circuit 400 of FIG. 4. A first signal processing circuit contains two amplifiers U1 and U2, with the associated switches and capacitors shown in FIG. 4. A second signal processing circuit contains two additional amplifiers U3 and U4, again with the associated switches and capacitors shown in FIG. 4.

In addition, in circuit 500, the two signal processing circuits are "cross-coupled," i.e., they are interconnected. Specifically, two additional "interconnect" capacitors that are not part of the basic signal processing circuit 400 of FIG. 4 are used to connect the two signal processing circuits present in circuit 500. Capacitor C4 couples the output of amplifier U1 in the first signal processing circuit to the inverting input of amplifier U4 in the second signal processing circuit, and capacitor C6 couples the output of amplifier U3 in the second signal processing circuit to the inverting input of amplifier U2 in the first signal processing circuit.

As with capacitor C3 in circuit 400 of FIG. 4, in circuit 500 capacitors C3, C4, C6, and C8 correspond to devices that would be switched capacitor resistors in a switched capacitor circuit in known approaches, but are not so configured in the present approach. Similarly, as with capacitors C1 and C2 in FIG. 4, in circuit 500 the signal independent state of the capacitors associated with the amplifiers, i.e., capacitors C1, C2, C5, and C7, also cause the non-switched capacitors C3, C4, C6, and C8, to move to a defined state since both the amplifier input (assumed to be at ground) and the output to which they connect are at a defined voltage also.

As above, the reset signal G controls the switches; it is not a clock-driven signal and has no predefined periodicity. The instance of reset signal G that controls switches S5 and S6 may again be delayed or advanced from the reset signal G that controls the other switches in circuit 500 to allow some short interval of time for the amplifiers to power up or for similar reasons.

Normally, when the reset signal G is active the system is being reset to a signal independent state. At this time the inputs will typically also be in a defined state; circuit 500 shows them being at ground, but this is not necessary as further explained below. Upon removal of the reset signal G the inputs are applied. A transient is induced in circuit 500 and propagates through it. Each amplifier is in turn disturbed by the input signal as it propagates, but circuit 500 will then settle to a fixed condition. That fixed condition, i.e., an unchanging charge on the capacitors that will be reached after a short time, is the sought-after function of the circuit. After the input transient has passed, a set of voltages will be present at the outputs of the amplifiers. For example, amplifiers U2 and U4 will each have a fixed output voltage. It is the achieving of this fixed output voltage that is the desired function of the circuit.

Even circuit 500 of FIG. 5 is a very simple implementation of the present approach, and much more complicated circuits may be used to solve complex problems. For example, a network following the approach described herein but considerably more complex than the circuits illustrated can calculate the Fast Fourier Transform (FFT) of a signal. Such a network will have multiple inputs, for example, 128 inputs that represent an input sequence. As the transient due to this input sequence propagates through the network, the FFT calculation is in progress.

When the transient dies down, a set of static voltages will present on the outputs, for example, on the 128 amplifier outputs at the end of the network, such as amplifiers U2 and U4 in circuit 500 of FIG. 5. The output sequence of voltages is the FFT of the input sequence. (In this example, the 128 inputs would represent 64 complex quantities and the 128 outputs another set of 64 complex quantities; as in the FFT, the 64 output quantities are partially redundant and 32 useful FFT "bins" are created.)

It is possible to compute FFTs and similar problems in an appropriate network because the capacitors that interconnect individual signal processing circuits (i.e., instances of circuit 400 of FIG. 4) such as capacitors C3, C4, C6, and C8 in FIG. 5) do not have to all be the same value. Each capacitor may have a different value, and the transient propagates through the network in response to the capacitors' relative values. As above, the charge is being redistributed as the transient propagates.

It will be apparent to one of skill in the art that in the case of an FFT or other complex problem, a network composed of individual signal processing circuits such as circuit 400 of FIG. 4 may be of any desired complexity and interconnectivity. It will also be apparent that it is not necessary for the individual signal processing circuits to be connected in pairs as shown in circuit 500 of FIG. 5, although in some situations such pairs may be appropriate.

Figure 6:
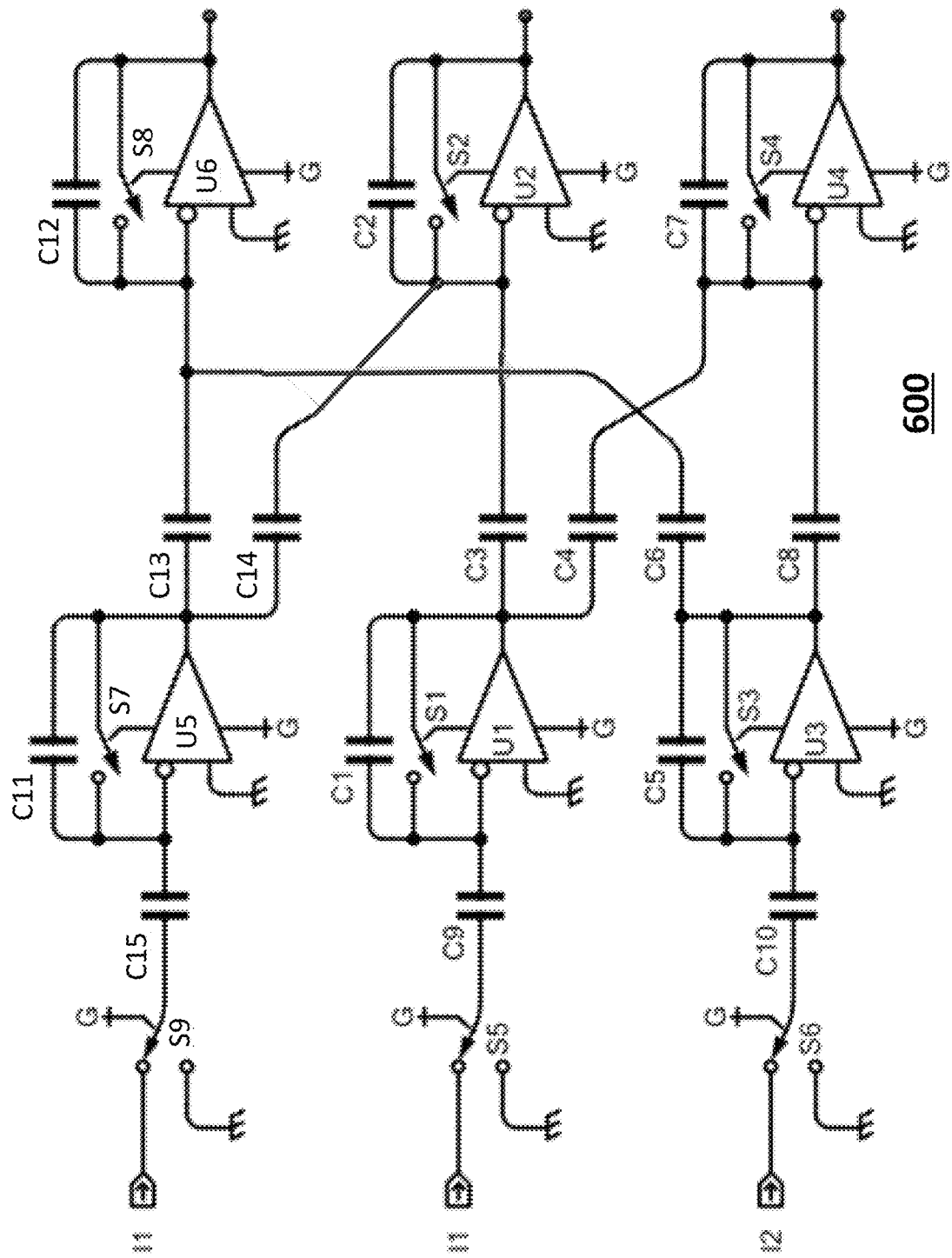
FIG. 6 is a diagram of a signal processing circuit according to yet another embodiment.

FIG. 6 illustrates another embodiment of the present approach in which individual signal processing circuits such as circuit 400 of FIG. 4 may be interconnected. It will be seen that circuit 600 of FIG. 6 now combines three of the signal processing circuits shown as circuit 400 of FIG. 4. A first signal processing circuit contains two amplifiers U1 and U2, with the associated switches and capacitors shown in FIG. 4. A second signal processing circuit contains two additional amplifiers U3 and U4, again with the associated switches and capacitors shown in FIG. 4.

As in circuit 500, the three signal processing circuits in circuit 600 are again interconnected, but unlike circuit 500 the connections are now not in pairs. Now while capacitor C4 couples the output of amplifier U1 in a first signal processing circuit to the inverting input of amplifier U4 in a second signal processing circuit, capacitor C6 couples the output of amplifier U3 in the second signal processing circuit to the inverting input of amplifier U6 in a third signal processing circuit, and capacitor C14 couples the output of amplifier U5 in the third signal processing circuit to the inverting input of amplifier U2 in the first signal processing circuit.

In other embodiments, capacitor C14 need not couple the third and first signal processing circuits as in circuit 600, but might couple the output of amplifier U5 in the third signal processing circuit to the inverting input of yet another amplifier in a fourth signal processing circuit. One of skill in the art will appreciate, in light of the teachings herein, that any appropriate number of individual signal processing circuits such as circuit 400 of FIG. 4 that are part of a large network may be connected in any way appropriate to solve a given problem.

The capacitors and switches shown in circuit 600, and reset signal G, function as described above with respect to circuits 400 and 500 to allow an input signal to propagate through circuit 600 and achieve an output state that includes the final output values of amplifiers U2, U4, and U6.

It will be apparent to one skilled in the art that more than one impulse or transient may be sent through the circuit without an intermediate reset with the reset signal G. If, for example, one set of input samples is applied to a network configured to solve an FFT as described above, the FFT output appears on the output ports. If the input is then changed to a second set of input samples, the output will change to the new FFT result. There is again no mediation of any clock; the function of the reset signal G differs from the function of a clock in the known art, and for this reason the reset signal G is accurately described as a reset signal. As above, the circuit conserves charge and generally speaking only requires reset due to second order effects such as leakage current accumulating on the capacitors and drift in the offsets in the amplifiers, caused by, for example, changes of temperature or 1/F noise as is well known in the art.

The inputs are shown in FIGS. 4, 5, and 6 as being at ground during the reset, and the transient is generated by the application of the input shortly after, or concurrent with, the removal of the reset signal G. However, this is not necessary. The inputs I1, I2, and I3 may by connected while reset signal G is active and connected to ground thereafter, so as to generate a negative impulse compared to the first case. For example, if I1 and I2 are differential inputs in FIG. 5, an inverse signal may be connected while reset signal G is active, and the non-inverse signal thereafter, so as to generate a transient responsive only to the differential input and not to the normal mode input. Those skilled in the art will realize, in light of the teachings herein, that other means to generate the input transient are possible.

It will further be apparent to those skilled in the art that while FIGS. 4, 5 and 6 show a single ended example, a differential embodiment is possible in which input 12 is the inverse of input I1 (this may be alternatively implemented by using input I1 as both inputs and reversing the connectivity of the positions of switch S6). A differential embodiment may in fact be preferred in some cases since this will allow negative coefficients of the capacitor connections (a negative input yields a negative capacitor coefficient which is implemented by a cross-coupling of capacitors C4 and C6 in the differential pair, with capacitors C3 and C8 removed).

Functioning of the network without the need to apply the reset G signal is possible because the network conserves charge. Once the amplifiers are active and the integrating capacitors are initialized the various inputs may be applied. Each input generates its own transient in the circuit and each transient will be independent.

The independence of the successive sequences of inputs may be desirable in order that the successive sequences do not interact. However, in some applications inter-sequence operations may be desired. For example, in the FFT application described above it may be desirable to return the averaged FFT of a sequence of input sequences. In such a case a first set of, for example, 64 samples may be collected and applied as inputs to the present approach configured as an FFT calculator. Shortly thereafter a second set of 64 samples may be collected and applied to the circuit.

As the present approach has been so far described the two output FFT results are independent. No reset is required between the two sets of samples and two independent FFT's result. However, it is possible to modify the circuit to prevent independence of outputs as shown in FIG. 7.

Figure 7:
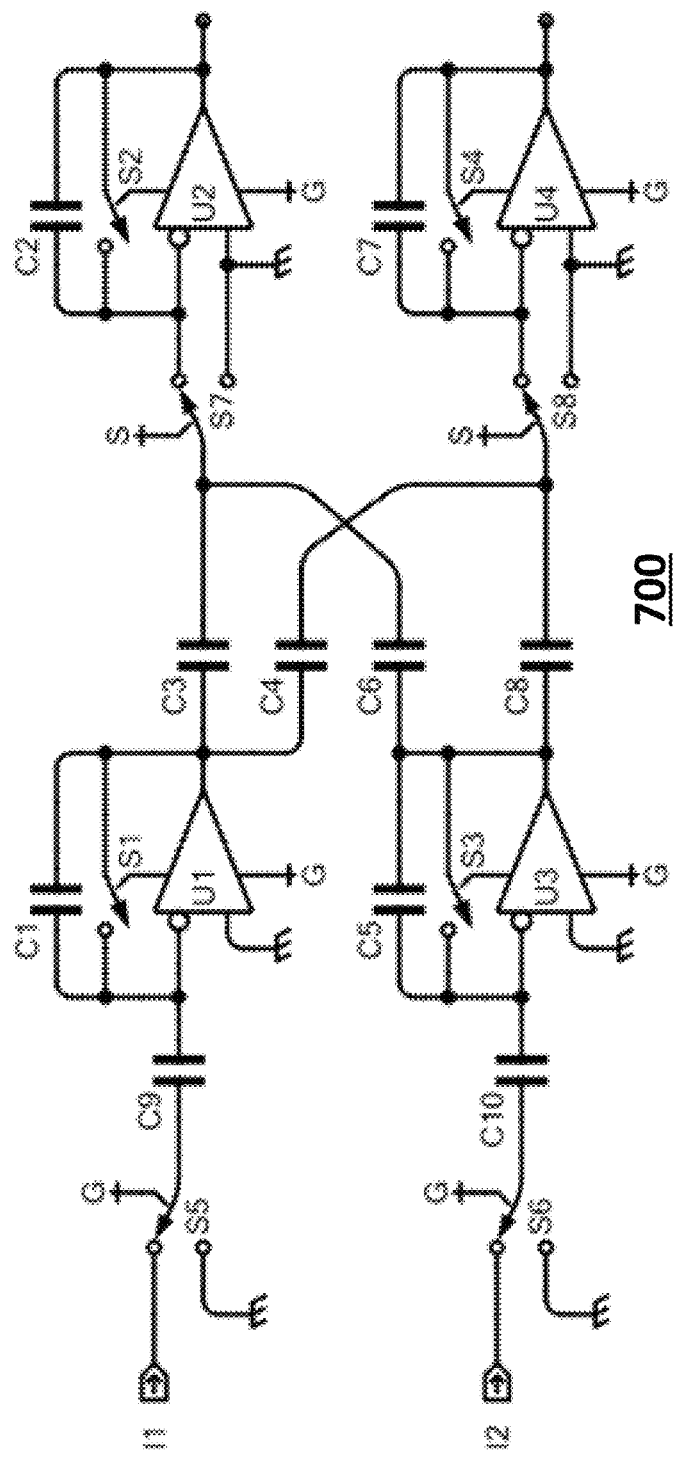
FIG. 7 is a diagram of a signal processing circuit according to still another embodiment.

Circuit 700 of FIG. 7 modifies circuit 500 of FIG. 5 by adding switches S7 and S8, controlled by a different control signal, an "averaging signal" S, before amplifiers U2 and U4 respectively. If the switches S7 and S8 are left in the position shown (thus implying that the averaging signal S is low) then the circuit operates as described above. However, if switches S7 and S8 are used with multiple input sequences between activations of the reset signal G, the results may be averaged by the repeated activations of the averaging signal S. (One of skill in the art will appreciate that the use of switches such as S7 and S8 is not limited to the embodiments shown in FIG. 5 or 7, but may be applied to any number or configuration of signal processing units as described herein.) The purpose of averaging signal S is to cause the results of the circuit operation to be averaged over some number of inputs; for this reason, averaging signal S, like reset signal G, is also not a clock signal and has no predefined periodicity but rather is activated only when appropriate to cause the results of multiple inputs to be averaged.

For example, in the FFT example (again requiring a much more complicated network than shown herein), after applying the reset signal G with switch control signal S low, the network will be in a nominal state with all outputs zero. A first set of samples is then applied to the input ports; this will have no effect while the reset signal G is applied, since the switches at the inputs are connected to ground.

Removing the reset signal G allows the first set of samples to generate a transient that propagates to the outputs, creating the FFT of the first set of inputs. The averaging signal S is then activated; this does not affect the outputs since the transient is already passed.

The set of inputs is then removed, causing the network to return to its nominal state because a reverse transient has propagated through, but the reverse transient will not reach the outputs due to the averaging signal S still being activated. Thus, the outputs are still at the FFT result from the first inputs. Now the averaging signal S is removed, but because the transient has passed this does not affect the outputs.

A second input sequence is now applied to the input, and results in a second transient that is propagated through the network and added to capacitors C2 and C7, which function as output integrators. The outputs are now the sum of two successive FFT integrations.

These steps are then repeated as many times as desired to sum a number of successive FFTs. When this is done, the averaging signal S is turned off and the reset signal G applied to clear the network for a next group of FFT sequences. One of skill in the art will appreciate in light of the teachings herein that the use of averaging signal S and associated switches for averaging the results of multiple inputs is not limited to the case of FFTs but may be used in any situation in which averaging of results is appropriate.

By using the present approach the averaging of outputs occurs due to the charge conserving nature of the network. Charge is conserved because once the reset signal G is removed the action of the amplifiers in creating the virtual ground ensures that every capacitor retains its charge, i.e., there is no path to discharge any capacitor except into another capacitor. A consequence of this is the entire circuit is mathematically linear; thus, in principle (and typically in practice) it is possible to determine what is in the network by treating it as a black box and exercising the inputs one at a time.

However, in some applications, the mathematically linear performance may not be a benefit; for example, circuits that attempt to categorize a signal into certain output bins, such as handwritten character recognition, speech recognition etc. are fundamentally non-linear. For such uses, the invention may be modified as shown in FIG. 8 to include a deliberate non-linearity (sometimes known as an "activation function") that alters the response of an element as its input is linearly increased.

Figure 8:
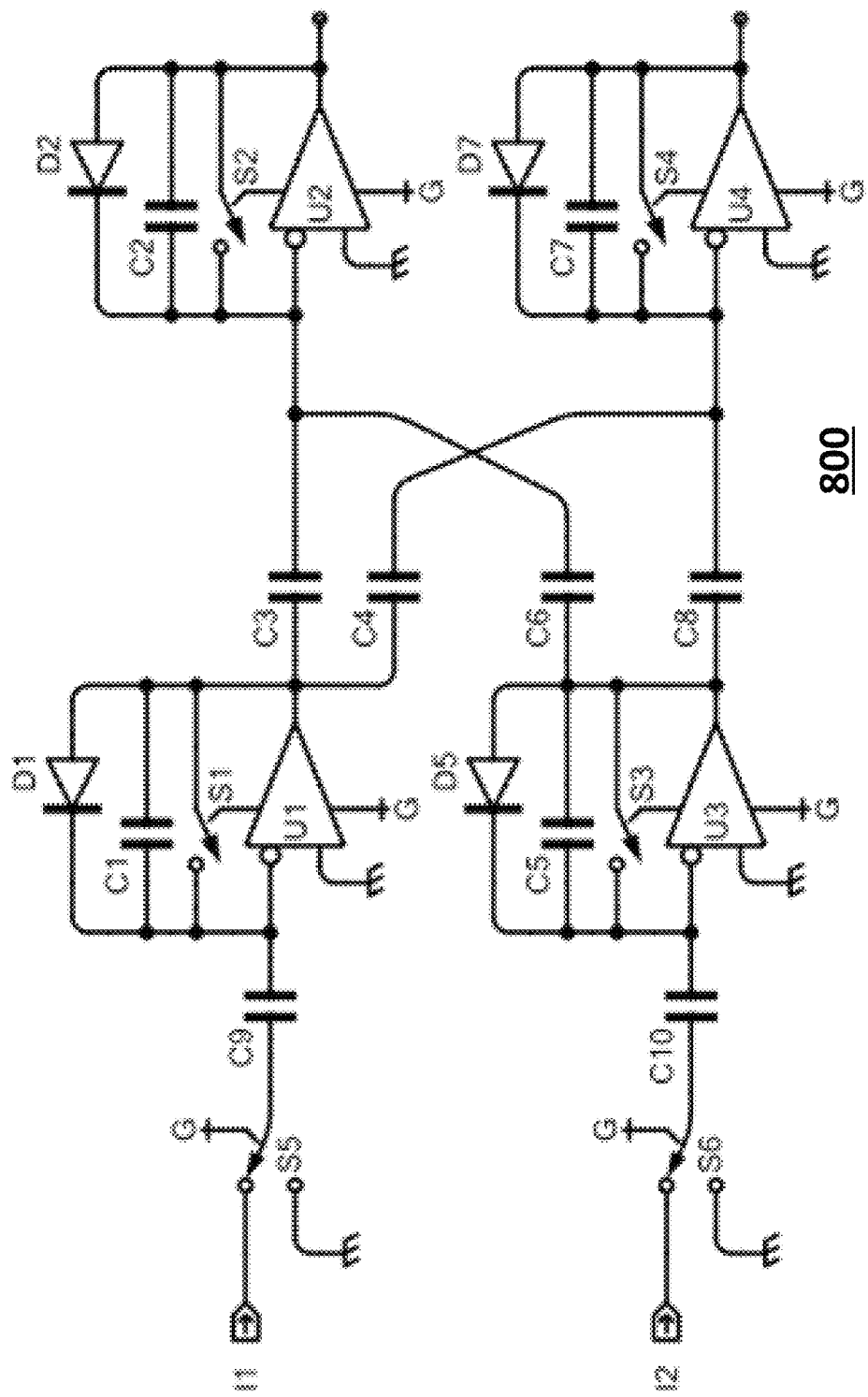
FIG. 8 is a diagram of a signal processing circuit according to yet another embodiment.

In circuit 800 in FIG. 8, each of the amplifier units contains a diode that, like the switch and capacitor in each amplifier unit, connects the output of the amplifier with the inverting input of the amplifier. Thus, a first amplifier unit contains an amplifier U1, a switch S1, a capacitor C1, and a diode D1. Diode D1 is oriented in the direction indicated.

These diodes D1, D2, D5 and D7 add a nonlinearity to the operation of circuit 800. Now it is no longer true that the circuit conserves charge; rather, if the voltage on the amplifier output exceeds the diode drop, the capacitor has a discharge path through the diode. This non-linearity, or activation function, can be a useful addition, as it allows the techniques of neural networks and artificial intelligence to be used in circuits made according to the present approach. (Again, the use of such diodes is not limited to the embodiments shown in FIG. 5 or 8, but may be applied to any number or configuration of signal processing units as described herein.)

Of course, considerably more complexity than that shown in FIG. 8 is required to make a neural network, but circuit 800 demonstrates all of the elements needed. Viewed as a neural network, the capacitors C3, C4, C6, and C8 are the weights in a neural network, and the amplifiers U1 to U4 are the neurons. By using a suitable set of weights, a network using the present approach as described herein can implement an analog neural network.

By combining these features, it is possible to construct signal processing circuits that may represent a wide variety of problems to be solved, and that compensates for finite open loop gain and for offset voltages in the components, thus allowing a circuit to calculate the result of a problem represented by the circuit immediately upon the presentation of a new input or set of inputs. One of skill in the art will appreciate, in light of the teachings herein, that a signal processing circuit of any desired or appropriate complexity may be constructed according to these principles. Further, analog neural networks may be implemented using the principles described herein.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art in light of the teachings herein. Further, the illustration of amplifiers and the associated feedback loops, capacitors, switches, etc., is exemplary; one of skill in the art will be able to select the appropriate type and number of elements that is appropriate for a particular application.

These and other variations upon the embodiments are intended to be covered by the present disclosure, which is limited only by the appended claims.

What is claimed is:

1. A signal processing circuit, comprising:
   a first amplifier unit comprising:
      a first amplifier having a non-inverting input, an inverting input and an output, the non-inverting input connected to a ground;
      a first capacitor having a first end connected to the inverting input of the first operational amplifier and a second end connected to the output of the first amplifier; and
      a first single-throw switch connected to a reset signal and configured to be in either an open position or a closed position based upon the reset signal, and having a first end connected to the inverting input of the first amplifier and a second end connected to the output of the first amplifier;
   a second amplifier unit comprising:
      a second amplifier having a non-inverting input, an inverting input and an output, the non-inverting input connected to the ground;
      a second capacitor having a first end connected to the inverting input of the second amplifier and a second end connected to the output of the second amplifier; and
      a second single-throw switch connected to the reset signal and configured to be in either an open position or a closed position based upon the reset signal, and having a first end connected to the inverting input of the second amplifier and a second end connected to the output of the second amplifier;
   a third single-throw switch connected to the reset signal and configured to be in either a first position or a second position based upon the reset signal, and having a first end and a second end, the first end configured to receive an input signal when the switch is in the first position and to connect to the ground when the switch is in the second position;
   a third capacitor having a first end connected to the second end of the third single-throw switch and a second end connected to the inverting input of the first amplifier; and
   a fourth capacitor having a first end connected to the output of the first amplifier and a second end coupled to the inverting input of the second amplifier.

2. The signal processing circuit of claim 1 wherein the first amplifier and the second amplifier are operational amplifiers.

3. The signal processing circuit of claim 1 further comprising:
   a first diode having a first end connected to the inverting input of the first amplifier and a second end connected to the output of the first amplifier, wherein the first diode allows current flow from the output of the first amplifier to the inverting input of the first amplifier and not in the reverse direction; and
   a second diode having a first end connected to the inverting input of the second amplifier and a second end connected to the output of the second amplifier, wherein the second diode allows current flow from the output of the second amplifier to the inverting input of the second amplifier and not in the reverse direction.

4. The signal processing circuit of claim 1 further comprising a fourth single-throw switch connected to an averaging signal and configured to be in either a first position or a second position based upon the averaging signal, and having a first end and a second end, the first end connected to the second end of the fourth capacitor and the second end configured to connect to the inverting input of the second amplifier when the switch is in the first position and to connect to the ground when the switch is in the second position.

5. A signal processing circuit, comprising:
   a first amplifier unit comprising:
      a first amplifier having a non-inverting input, an inverting input and an output, the non-inverting input connected to a ground;
      a first capacitor having a first end connected to the inverting input of the first amplifier and a second end connected to the output of the first amplifier; and
      a first single-throw switch connected to a reset signal and configured to be in either an open position or a closed position based upon the reset signal, and having a first end connected to the inverting input of the first amplifier and a second end connected to the output of the first amplifier;
a second amplifier unit comprising:
  a second amplifier having a non-inverting input, an inverting input and an output, the non-inverting input connected to the ground;
  a second capacitor having a first end connected to the inverting input of the second operational amplifier and a second end connected to the output of the second operational amplifier; and
  a second single-throw switch connected to the reset signal and configured to be in either an open position or a closed position based upon the reset signal, and having a first end connected to the inverting input of the second operational amplifier and a second end connected to the output of the second operational amplifier;
a third amplifier unit comprising:
  a third amplifier having a non-inverting input, an inverting input and an output, the non-inverting input connected to the ground;
  a third capacitor having a first end connected to the inverting input of the third amplifier and a second end connected to the output of the third amplifier; and
  a third single-throw switch connected to the reset signal and configured to be in either an open position or a closed position based upon the reset signal, and having a first end connected to the inverting input of the third amplifier and a second end connected to the output of the third amplifier;
a fourth amplifier unit comprising:
  a fourth amplifier having a non-inverting input, an inverting input and an output, the non-inverting input connected to the ground;
  a fourth capacitor having a first end connected to the inverting input of the fourth amplifier and a second end connected to the output of the fourth amplifier; and
  a fourth single-throw switch connected to the reset signal and configured to be in either an open position or a closed position based upon the reset signal, and having a first end connected to the inverting input of the fourth amplifier and a second end connected to the output of the fourth amplifier;
a fifth single-throw switch connected to the reset signal and configured to be in either a first position or a second position based upon the reset signal, and having a first end and a second end, the first end configured to receive an input signal when the switch is in the first position and to connect to the ground when the switch is in the second position;
a fifth capacitor having a first end connected to the second end of the fifth single-throw switch and a second end connected to the inverting input of the first amplifier;
a sixth single-throw switch connected to a reset signal and configured to be in either a first position or a second position based upon the reset signal, and having a first end and a second end, the first end configured to receive an input signal when the switch is in the first position and to connect to the ground when the switch is in the second position;
a sixth capacitor having a first end connected to the second end of the sixth single-throw switch and a second end connected to the inverting input of the third amplifier;

a seventh capacitor having a first end connected to the output of the first amplifier and a second end coupled to the inverting input of the second amplifier;
an eighth capacitor having a first end connected to the output of the third amplifier and a second end coupled to the inverting input of the fourth amplifier;
a ninth capacitor having a first end connected to the output of the first amplifier and a second end coupled to the inverting input of the fourth amplifier; and
a tenth capacitor having a first end connected to the output of the third amplifier and a second end coupled to the inverting input of the second amplifier.

6. The signal processing circuit of claim 5 wherein the first amplifier and the second amplifier are operational amplifiers.

7. The signal processing circuit of claim 5 further comprising:
  a first diode having a first end connected to the inverting input of the first amplifier and a second end connected to the output of the first amplifier, wherein the first diode allows current flow from the output of the first amplifier to the inverting input of the first amplifier and not in the reverse direction;
  a second diode having a first end connected to the inverting input of the second amplifier and a second end connected to the output of the second amplifier, wherein the second diode allows current flow from the output of the second amplifier to the inverting input of the second amplifier and not in the reverse direction;
  a third diode having a first end connected to the inverting input of the third amplifier and a second end connected to the output of the third amplifier, wherein the third diode allows current flow from the output of the third amplifier to the inverting input of the third amplifier and not in the reverse direction; and
  a fourth diode having a first end connected to the inverting input of the fourth amplifier and a second end connected to the output of the fourth amplifier, wherein the fourth diode allows current flow from the output of the fourth amplifier to the inverting input of the fourth amplifier and not in the reverse direction.

8. The signal processing circuit of claim 5 further comprising:
  a seventh single-throw switch connected to an averaging signal and configured to be in either a first position or a second position based upon the averaging signal, and having a first end and a second end, the first end connected to the second end of the seventh capacitor and the second end of the ninth capacitor, and the second end configured to connect to the inverting input of the fourth amplifier when the switch is in the first position and to connect to the ground when the switch is in the second position.
  an eighth single-throw switch connected to the averaging signal and configured to be in either a first position or a second position based upon the averaging signal, and having a first end and a second end, the first end connected to the second end of the eighth capacitor and the second end of the tenth capacitor, and the second end configured to connect to the inverting input of the second amplifier when the switch is in the first position and to connect to the ground when the switch is in the second position.

9. A signal processing network, comprising:
a plurality of signal processing circuits, each signal processing circuit comprising:

a first amplifier unit comprising:
  a first amplifier having a non-inverting input, an inverting input and an output, the non-inverting input connected to a ground;
  a first capacitor having a first end connected to the inverting input of the first operational amplifier and a second end connected to the output of the first amplifier; and
  a first single-throw switch connected to a reset signal and configured to be in either an open position or a closed position based upon the reset signal, and having a first end connected to the inverting input of the first amplifier and a second end connected to the output of the first amplifier;
a second amplifier unit comprising:
  a second amplifier having a non-inverting input, an inverting input and an output, the non-inverting input connected to the ground;
  a second capacitor having a first end connected to the inverting input of the second amplifier and a second end connected to the output of the second amplifier; and
  a second single-throw switch connected to the reset signal and configured to be in either an open position or a closed position based upon the reset signal, and having a first end connected to the inverting input of the second amplifier and a second end connected to the output of the second amplifier;
a third single-throw switch connected to the reset signal and configured to be in either a first position or a second position based upon the reset signal, and having a first end and a second end, the first end configured to receive an input signal when the switch is in the first position and to connect to the ground when the switch is in the second position;
  a third capacitor having a first end connected to the second end of the third single-throw switch and a second end connected to the inverting input of the first amplifier; and
  a fourth capacitor having a first end connected to the output of the first amplifier and a second end coupled to the inverting input of the second amplifier;
a fifth capacitor having a first end connected to the output of the first amplifier in a first one of the plurality of signal processing units and a second end coupled to the inverting input of the second amplifier in a second one of the plurality of signal processing units; and
a sixth capacitor having a first end connected to the output of the first amplifier in the second one of the plurality of signal processing units and a second end coupled to the inverting input of the second amplifier in a third one of the plurality of signal processing units.

10. The signal processing network of claim 9 further comprising a seventh capacitor having a first end connected to the output of the first amplifier in the third one of the plurality of signal processing units and a second end coupled to the inverting input of the second amplifier in a fourth one of the plurality of signal processing units.

11. The signal processing network of claim 9 further comprising a seventh capacitor having a first end connected to the output of the first amplifier in the third one of the plurality of signal processing units and a second end coupled to the inverting input of the second amplifier in the first one of the plurality of signal processing units.

* * * * *